(12) United States Patent
Vervaeke et al.

(10) Patent No.: US 10,408,894 B2
(45) Date of Patent: Sep. 10, 2019

(54) DEVICES AND METHODS FOR DETERMINING A MAGNETIC FIELD

(71) Applicant: MagCam NV, Leuven (BE)

(72) Inventors: Koen Vervaeke, Linden (BE); Lieven Philips, Langdorp (BE)

(73) Assignee: MAGCAM NV, Leuven (BE)

( * ) Notice: Subject to any disclaimer, the term of this patent is extended or adjusted under 35 U.S.C. 154(b) by 0 days.

(21) Appl. No.: 15/037,010

(22) PCT Filed: Apr. 2, 2015

(86) PCT No.: PCT/EP2015/057291
§ 371 (c)(1),
(2) Date: May 16, 2016

(87) PCT Pub. No.: WO2015/155109
PCT Pub. Date: Oct. 15, 2015

(65) Prior Publication Data
US 2017/0038440 A1  Feb. 9, 2017

(30) Foreign Application Priority Data

Apr. 9, 2014 (EP) .................................... 14164073

(51) Int. Cl.
*G01R 33/10* (2006.01)
*G01R 33/07* (2006.01)
*G01R 33/12* (2006.01)

(52) U.S. Cl.
CPC ............. *G01R 33/10* (2013.01); *G01R 33/12* (2013.01); *G01R 33/072* (2013.01);
(Continued)

(58) Field of Classification Search
CPC .... G01R 33/10; G01R 33/12; G01R 33/1215; G01R 33/1253; G01R 33/1207; G01R 33/072
See application file for complete search history.

(56) References Cited

U.S. PATENT DOCUMENTS

| | | | |
|---|---|---|---|
| 5,073,858 A | * | 12/1991 | Mills ...................... G01R 33/16 324/201 |
| 6,344,743 B1 | * | 2/2002 | Holmes ................ G01R 33/045 324/244.1 |

(Continued)

FOREIGN PATENT DOCUMENTS

| | | | | |
|---|---|---|---|---|
| CN | 105719277 A | * | 6/2016 | |
| KR | 101723789 B1 | * | 4/2017 | |
| WO | WO 2014060224 A1 | * | 4/2014 | ......... G01R 33/0094 |

OTHER PUBLICATIONS

Hwang, J., et al., "The application of differential-type Hall sensors array to the nondestructive testing of express train wheels," NDT&E International, 2009, vol. 42, pp. 34-41.

(Continued)

*Primary Examiner* — Jarrett J Stark
(74) *Attorney, Agent, or Firm* — Leydig, Voit & Mayer, Ltd.

(57) ABSTRACT

A method and device for determining values of a magnetic field component of a magnetic vector field.
A method for determining values of a magnetic field component of a magnetic vector field, comprising:
  determining first distribution data comprising values of the magnetic field component, for a first predetermined area defined along a predetermined surface;
  determining second distribution data comprising second values of the component of the magnetic field for a second predetermined area defined along a second predetermined surface, wherein the first and the second predetermined surfaces are parallel;
wherein determining second distribution data comprises manipulation of the first distribution data based on making use of intrinsic physical properties of the magnetic field; and associated device.

24 Claims, 8 Drawing Sheets

(52) U.S. Cl.
CPC ...... *G01R 33/1207* (2013.01); *G01R 33/1215* (2013.01); *G01R 33/1253* (2013.01)

(56) References Cited

U.S. PATENT DOCUMENTS

| | | | | |
|---|---|---|---|---|
| 6,515,471 | B1* | 2/2003 | Santos | G01D 5/2452 324/207.2 |
| 2002/0079888 | A1* | 6/2002 | Frissen | H02K 41/031 324/207.2 |
| 2002/0158631 | A1* | 10/2002 | Kandori | A61B 5/04009 324/248 |
| 2003/0048102 | A1* | 3/2003 | Bartingale | G05D 1/0263 324/260 |
| 2006/0183996 | A1* | 8/2006 | Abe | G01R 33/563 600/410 |
| 2007/0046287 | A1* | 3/2007 | Vervaeke | G01R 33/0094 324/251 |
| 2008/0203828 | A1* | 8/2008 | Compter | G03F 7/70758 310/12.06 |
| 2012/0209546 | A1 | 8/2012 | Vervaeke et al. | |
| 2013/0015845 | A1* | 1/2013 | Fox | G01D 5/145 324/207.21 |
| 2015/0248910 | A1* | 9/2015 | Itaya | G11B 5/73 428/836 |
| 2017/0035386 | A1* | 2/2017 | Kiyan | A61B 8/0875 |

OTHER PUBLICATIONS

Hwang, J., et al., "Modeling of a Scan Type Magnetic Camera Image Using the Improved Dipole Model," J. of Mech. Sci. & Tech., 2006, vol. 20, No. 10, pp. 1691-1701.

Benitez, D.S., et al., "A 1-D Solid-State-Sensor-Based Array System for Magnetic Field Imaging of Steel Reinforcing Bars Embedded Within Reinforced Concrete," IEEE Transactions on Instrumentation and Measurement, Jul. 2009, vol. 58, No. 9, pp. 3335-3340.

Cajal, D., et al., "A study of the various phases of the break in a low-voltage circuit breaker thanks to the magnetic camera," Journal of Physics D: Applied Physics, May 1999, vol. 32, No. 10, pp. 1130-1135.

* cited by examiner

Fig. 2

DEVICES AND METHODS FOR DETERMINING A MAGNETIC FIELD

CROSS-REFERENCE TO RELATED APPLICATIONS

This application is a § 371 national stage entry of International Application No. PCT/EP2015/057291, filed Apr. 2, 2015, which claims prioroty to European Patent Application No. 14164073.0 filed Apr. 9, 2014, the entire contacts of which are incorporated herein by reference.

TECHNICAL FIELD

The present disclosure relates to devices and methods for determining a magnetic field of a magnet.

BACKGROUND ART

Fast and accurate quality inspection of permanent magnets is increasingly important in development and production of many technological products, such as position sensors, electric motors and actuators, speakers and microphones, medical devices, automotive electronics etc. The quality of the end product is often directly influenced and largely dependent on the quality of permanent magnets in these products. Moreover, price volatility of rare earth materials, which are critical for making permanent magnets, force developers and manufacturers to use these precious materials in an efficient way, minimizing the amount of wasted magnet material, in other words, get the most performance out of the least amount of magnet material, meaning each magnet needs to conform to strict quality demands. Also from an economic point of view, quality control of permanent magnets is growing in importance.

A magnetic measurement system is known, also referred to as a magnetic field camera, which is an advanced magnet inspection technology for all kinds of permanent magnets, including uniaxial and multi pole magnets in various applications. The magnetic field camera technology is based on mapping the magnetic field distribution of a magnet using a plurality of magnetic field sensors.

In European patent application EP1720026, an example of such a magnetic field camera, also called a magnetic camera module, is described.

In European patent application EP2508906, an arrangement is described for characterizing magnetic systems based on an initialized set of input parameters of the magnetic system, the arrangement comprising:

means for measuring the magnetic field distribution, typically embodied as a magnetic camera module, and means for determining an optimal expected magnetic field distribution of the magnetic system.

Existing magnetic camera devices are able to measure the out-of-plane component or z-component of a magnetic field, with respect to the plane defined by the camera's sensing surface. The out-of-plane component or z-component of a magnetic field is thereby only determined along a predetermined two-dimensional surface.

There exists a need in industry to quickly and efficiently determine the out-of-plane component or z-component of such magnetic field in a three dimensional volume, i.e. for instance at different heights above a magnetic camera's main sensing surface.

SUMMARY OF THE DISCLOSURE

It is an aim of the present disclosure to provide a method and associated devices for determining a magnetic vector field distribution in a predetermined area, for instance along a main surface of a magnet.

This aim is achieved according to the disclosure with the method and device showing the technical characteristics of the independent claims.

In a first aspect of the present invention, a method is disclosed for determining values of a magnetic field component of a magnetic vector field (for instance a magnetic vector field generated by a magnet under inspection), comprising:

determining first distribution data comprising values of the magnetic field component, for a first predetermined area defined along a first predetermined surface (for instance by means of a magnetic field camera);

determining second distribution data comprising second values of the component of the magnetic field for a second predetermined area defined along a second predetermined surface, wherein the first and the second predetermined surfaces are parallel;

wherein determining second distribution data comprises manipulation of the first distribution data based on making use of intrinsic physical properties of the magnetic field.

The first and second predetermined surfaces can be for instance flat surfaces, or can be curved. Alternatively, they can for instance be embodied as cylindrical surfaces or spherical surfaces.

For the purpose of the present description, a magnetic field component comprises the magnitude of the projection of the magnetic field vector on an axis or on a surface, or the magnitude of the magnetic field vector itself.

In preferred embodiments, the magnetic field component is the "z"—component of a magnetic field, which is the out of plane component with respect to a plane defined by an x-axis and a y-axis, the x-, y- and z-axes forming an orthogonal set.

The first predetermined surface and first predetermined area along that surface can correspond to a sensing area of a magnetic field camera. The first predetermined area can for instance correspond to the total sensing area of a magnetic field camera, or to a total area scanned by one or more magnetic field cameras.

A magnetic field camera can for instance comprise an array or matrix of Hall sensors, or can be a magneto-optical system, or can comprise an array of other magnetic field sensors, such as magneto-resistive sensors, or it can comprise a single magnetic field sensor which is scanned in space.

The second predetermine surface can be a parallel surface at some distance (different from zero; the first and second predetermined surfaces being different parallel surfaces) from the first predetermined surface, for instance at some distance above a magnetic field camera's sensing area.

It is an advantage of the above method that, while measuring a first component of a magnetic vector field along a single surface, the values of the first component can be determined along a second, parallel surface, without the need to measure the magnetic field at different distances, for instance at different vertical heights above a magnetic source. This allows a determination of the values of the first component in 3D. The method has the advantage of being relatively fast. Moreover, a system architecture comprising means for measuring at different heights/distances from a magnet's surface is not required, which would be the case in an alternative, straight forward solution to the problem. A further advantage is that no loss on the signal-to-noise ratio is occurring, which would occur when one would measure at larger distances from the magnetic field source in such a straight forward solution to the problem. Indeed, a magnetic field has a strength which quickly decreases over distance from the source (as $1/r^3$), resulting in strong relative increase of the noise when taking distance from the magnetic field source. In aspects of the present invention, high-frequency components are attenuated automatically, resulting in a low-pass filter, ending up in relatively high signal-to-noise ratios.

It is further advantageous that the straight forward use of very sensitive magnetic field sensors for measuring the magnetic field at relatively large distance, where the field is very weak, can be avoided. Indeed, the use of less sensitive magnetic field sensors at short distance is possible, which still allows determining this relatively weak field at larger distances.

Preferably, the first predetermined area has a surface which is smaller than 1 m². More preferably, the first predetermined area has a surface which is smaller than 100 cm².

Preferably, the first distribution data is determined on a two-dimensional grid. This two-dimensional grid preferably has a spacing between its points of less than 2 mm (or 2°) in both the first and second directions. More preferably said spacing is less than 0.2 mm (or 0.2°) in the directions, the unit of 'mm' or '°' being determined by the unit of the corresponding axis in the used coordinate system.

The first, second and third directions can for instance constitute an orthogonal axis system with Cartesian coordinates (X, Y, Z). In such a reference system, a magnetic vector field is represented by a set of orthogonal components ($B_x$, $B_y$, $B_z$). The component to be determined can for instance correspond to the Z-component $B_z$ of a magnetic field, which is the out of plane component of a vector field with respect to a plane defined by the X and Y axes of the coordinate system. The X and Y axes of the coordinate system define a plane which can correspond to a measurement surface, for instance an upper surface of a magnetic field sensor of a magnetic field camera.

Alternatively, the first, second and third directions can for instance constitute an orthogonal axis system with cylindrical coordinates (R, θ, Z). In such a reference system, a magnetic vector field is represented by a set of orthogonal components ($B_r$, $B_θ$, $B_z$). The component to be determined can for instance correspond to the R-component of a magnetic field $B_r$, which is the radial component of a vector field with respect to a cylinder axis defined by the Z axis of the coordinate system. The θ and Z axes of the coordinate system define, for a certain R-value, a cylinder surface which can correspond to the measurement surface of a one-dimensional array of magnetic field sensors, which measure the radial component of the magnetic field (i.e. the component along said R-axis), and which is scanned while the cylinder is rotating.

Alternatively, the first, second and third directions van for instance constitute an orthogonal axis system with spherical coordinates (R, θ, φ). In such a reference system, a magnetic vector field is field is represented by a set of orthogonal components ($B_r$, $B_θ$, $B_φ$). The component to be determined, can for instance correspond to the R-component of a magnetic field $B_r$, which is the radial component of a vector field with respect to a point defined by the center of the spherical coordinate system. The θ and φ axes of the coordinate system define a spherical surface which can correspond to the measurement surface of a bent one-dimensional array of magnetic field sensors, which measure the radial component of the magnetic field (i.e. the component along said R-axis). The sensors can thereby for instance be arranged on a half circle which is then rotated around the center point, thereby describing a spherical surface, on which a grid of measurement points results.

According to preferred embodiments of the present invention, determining second distribution data of the component comprises performing a Fourier transformation of the first distribution data resulting in Fourier transformed data, followed by performing data manipulation on the Fourier transformed data resulting in manipulated Fourier transformed data, followed by an inverse Fourier transformation of the manipulated Fourier transformed data.

A Fourier transformation is known to the skilled person. The Fourier Transform is a mathematical transformation which is commonly used in image processing and is used to decompose an image (or a two-dimensional array of data points) into its sine and cosine components. The output of the transformation represents the image in the Fourier or frequency domain, while the input image is the spatial domain equivalent. In the Fourier domain image, each point represents a particular frequency contained in the spatial domain image. The frequency is here to be understood in terms of spatial frequency, also called 'k-space', which term is commonly used to describe spatial frequencies, also called 'wave numbers'. However, the mathematical operations used in Fourier Transforms make abstraction of the units and coordinate system that are used, and are equally useable for time domain signals (which are usually one-dimensional), as well as spatial domain signals, be they one-dimensional, two-dimensional or even 'n-dimensional' (where 'n' is any strictly positive integer number). For the case where 'n'=2, being the two-dimensional case, the spatial domain can furthermore be specified in any coordinate system, such as a Cartesian, cylindrical or spherical coordinate system. In every such case, the distribution data can be formalized in a two-dimensional matrix to which the Fourier transform can be applied.

In preferred embodiments, manipulation of the Fourier transformed data comprises multiplying the Fourier transformed data with a factor which is a function of spatial frequencies corresponding to a first and a second direction, the first and second direction being orthogonal and defining the first predetermined surface.

In preferred embodiments, manipulation of the Fourier transformed data comprises multiplying the Fourier transformed data with a factor which is a function of spatial frequencies corresponding to a first and a second direction, the first and second direction being orthogonal and defining the first predetermined surface.

In preferred embodiments, the factor is a function of a magnitude of a spatial frequency vector determined by the first and second direction.

In preferred embodiments, the factor comprises an exponential function.

In preferred embodiments, the factor is a function of a distance along a third direction, the third direction being orthogonal on the first and the second directions, between the first predetermined surface and the second predetermined surface.

In preferred embodiments, the exponential function comprises the distance along the third direction in its exponent.

In preferred embodiments, the exponential function comprises a magnitude of the spatial frequency vector determined by the first and second directions in its exponent.

More details on the manipulation of the distribution data can be retrieved in the detailed description.

According to preferred embodiments, the magnetic vector field is a field which needs to be characterized by a magnetic camera device. For instance, the magnetic vector field can be the field generated by a permanent magnet, an assembly of permanent magnets, an electromagnet, or any other object which acts as a source of magnetic field, the qualities of which have to be measured.

The magnetic camera device can be for instance a camera device based on a matrix of Hall-sensors, or a magnetic camera device of the magneto-optical type, or it can be based on a matrix of other magnetic field sensors such as magneto-resistive sensors or pickup coils. These embodiments are especially beneficial when the distribution data are to be characterized in a Cartesian coordinate system.

According to preferred embodiments, the magnetic vector field is a field which needs to be characterized by a one-dimensional array of magnetic field sensors, such as Hall sensors, magneto-resistive sensors, or pickup coils, that is mechanically scanned in one direction in order to obtain a two-dimensional distribution of the magnetic field. Thereby the scanning direction could be in a Cartesian direction (X, Y or Z) or in an axis in a cylindrical coordinate system (R, θ or Z), for example by relatively rotating the sensor array and the magnetic field source to be measured, or it can be in a spherical coordinate system. For instance, the magnetic vector field can be the field generated by a permanent magnet, an assembly of permanent magnets, an electromagnet, or any other object which acts as a source of magnetic field, the qualities of which have to be measured. These embodiments are especially beneficial when the distribution data need to be characterized in a Cartesian or cylindrical coordinate system.

According to preferred embodiments, the magnetic vector field is a field which needs to be characterized by one single magnetic field sensor, such as a Hall sensor, a magneto-resistive sensor, or a pickup coil, that is mechanically scanned in two directions in order to obtain a two-dimensional distribution of the magnetic field. Thereby the scanning direction could be in a Cartesian direction (X, Y or Z) or in an axis in a cylindrical coordinate system (R, θ or Z), for example by relatively rotating the sensor and the magnetic field source to be measured, or it can be in a spherical coordinate system. For instance, the magnetic vector field can be the field generated by a permanent magnet, an assembly of permanent magnets, an electromagnet, or any other object which acts as a source of magnetic field, the qualities of which have to be measured. These embodiments are especially beneficial when the distribution data need to be characterized in a Cartesian or cylindrical coordinate system.

According to preferred embodiments, the method further comprises:
- generating additional distribution data of the first component, the additional distribution data comprising expected values for the first component of the magnetic field in an extension area, the extension area adjacent to the predetermined area and along the first surface; and
- determining extrapolated distribution data for an extended set of distribution data, the extended set of distribution data comprising the first distribution data and the additional distribution data.

The predetermined surface and predetermined area along that surface can for instance correspond to a sensitive area of a magnetic camera device. The predetermined area can for instance correspond to the total sensitive area of a magnetic camera device.

It is an additional advantage of this type of embodiments, that the second distribution data of the component of the magnetic vector field can be determined much more precisely than if no additional distribution data would be generated. Indeed, by generating the additional distribution data and applying for instance a Fourier transform to the extended set of distribution data, performing manipulations based on intrinsic physical properties of a magnetic field and performing an inverse Fourier transform, the determination of the component of the magnetic vector field along a second surface parallel to the first surface, correspond better to the real values of that component.

According to preferred embodiments, determining distribution data comprising values of a component of a magnetic field, for a predetermined area defined in a predetermined surface, comprises measuring measurement values of the component by means of a magnetic camera.

According to preferred embodiments, determining distribution data comprising values of a component of a magnetic field, for a predetermined area defined in a predetermined surface, comprises measuring measurement values of the component by means of a one-dimensional array of magnetic field sensors the position of which is mechanically driven in order to scan the predetermined area.

According to preferred embodiments determining distribution data comprising values of a component of a magnetic field, for a predetermined area defined in a predetermined surface, comprises measuring measurement values of the component by means of one magnetic field sensor the position of which is mechanically driven in order to scan said predetermined area.

According to preferred embodiments, determining distribution data comprising values of a component of a magnetic field, for a predetermined area defined in a predetermined surface, further comprises modeling the measurement values of the first component based on a predetermined model and/or predetermined input parameters. This can for instance be performed with methods and devices disclosed in EP2508906.

According to preferred embodiments, the distribution data of the component comprises non-zero values for the component of the magnetic field corresponding to a location at an outer border of the predetermined area.

According to preferred embodiments, the method comprises determining the values of the component comprised in the additional distribution data by simulation of the component in the predetermined area and extrapolating the simulation into the extension area.

According to preferred embodiments, the values of the component comprised in the additional distribution data are set to zero.

According to preferred embodiments, the values of the component comprised in the additional distribution data are set to be monotonously decreasing to zero in the extension area when moving from an outer boundary of the predetermined area, away from the predetermined area, towards an outer border of the extension area.

According to preferred embodiments, the method comprises determining the values of the component comprised in the additional distribution data by:
- extrapolating or setting values of the first distribution data of the component corresponding to the outer boundary of the predetermined area onto the extension area;

applying a window-function on the extrapolated values for the extension area, said window function evolving from value 1 to value 0 over the extension area when moving away from the predetermined area.

According to preferred embodiments, the method comprises determining the values of the component comprised in the additional distribution data by generating values of the component which are exponentially decreasing over the extension area when moving away from the predetermined area, starting from the outer boundary of the predetermined area, such that the values of the first component are attenuated towards zero, i.e. close to zero or zero, at the outer boundary of the extension area.

Optionally, additionally, a window-function can be applied on the exponentially decreasing values for the extension area, the window function evolving from value 1 to value 0 over the extension area when moving away from the predetermined area.

According to preferred embodiments, the method comprises determining the values of the component comprised in the additional distribution data by:
  generating a spline, polynomial or rational representation of the values of the component of the magnetic field for at least part, at least an outer or peripheral part, or all of the predetermined area;
  extrapolating the spline, polynomial or rational representation to extrapolated values of the component of the magnetic field in the extension area;
  optionally, applying a window-function on the extrapolated values for the extension area, the window function evolving from value 1 to value 0 over the extension area when moving away from the predetermined area.

A spline representation is known to the skilled person. A spline is a sufficiently smooth polynomial function that is piecewise-defined, and possesses a high degree of smoothness at the places where the polynomial pieces connect. Also the concepts of a polynomial representation and a rational representation are supposed to be known to the skilled person.

According to preferred embodiments, determining second distribution data of the component comprising performing a Fourier transformation of the first distribution data resulting in Fourier transformed data, followed by performing data manipulation on the Fourier transformed data resulting in manipulated Fourier transformed data, followed by an inverse Fourier transformation of the manipulated Fourier transformed data, is performed over the total area of predetermined area and, if present, the extension area, in a block- or section-wise manner, thereby using the 'overlap-add' or 'overlap-save' methods.

In a second aspect of the present invention, a device or apparatus for determining values of a magnetic field component of a magnetic vector field is disclosed, comprising:
  a means or apparatus for determining first distribution data comprising values of the magnetic field component, for a first predetermined area defined along a predetermined surface;
  a means or apparatus for determining second distribution data comprising second values of the component of the magnetic field for a second predetermined area defined along a second predetermined surface, wherein the first and the second predetermined surfaces are parallel;
wherein the means or apparatus for determining second distribution data is adapted for manipulating the first distribution data based on making use of intrinsic physical properties of the magnetic field.

According to preferred embodiments of the present invention, the means or apparatus for determining second distribution data of the component is adapted for performing a Fourier transformation of the first distribution data resulting in Fourier transformed data, followed by performing data manipulation on the Fourier transformed data resulting in manipulated Fourier transformed data, followed by an inverse Fourier transformation of the manipulated Fourier transformed data.

According to preferred embodiments, the means for determining a distribution of a component in the predetermined area comprises a magnetic camera device comprising a sensing area, the sensing area corresponding to the predetermined area.

According to preferred embodiments, the means for determining a distribution of a first component in the predetermined area comprises a one-dimensional array of magnetic field sensors the position of which is mechanically driven in order to scan the first predetermined area, and records the first component of the distribution in the predetermined area.

According to preferred embodiments, the means for determining a distribution of a component in the predetermined area comprises a single magnetic field sensor the position of which is mechanically driven in order to scan the predetermined area and records the component of the distribution in the predetermined area.

According to preferred embodiments, the device further comprises a means or apparatus for generating additional distribution data of the component, the additional distribution data comprising expected values for the component of the magnetic field in an extension area, the extension area adjacent to the predetermined area; and a means for performing a Fourier transformation on an extended set of distribution data, the extended set of distribution data comprising the distribution data and the additional distribution data.

According to preferred embodiments, the means or apparatus for generating additional distribution data of the component comprises a means for simulating the first component in the predetermined area and extrapolating the simulation into the extension area.

According to preferred embodiments of the present invention, the means or apparatus for determining second distribution data of the component is adapted for performing any of the embodiments of the first aspect.

According to preferred embodiments of the present invention, the means or apparatus for generating additional distribution data of the components adapted for performing any of the embodiments of the first aspect.

According to a third aspect of the present invention, a software, computer code or computer program is disclosed which is adapted for performing any of the embodiments of the present invention of the first aspect, when run on a computer.

Features and advantages disclosed for one of the above aspects of the present invention are hereby also implicitly disclosed for the other aspects, mutatis mutandis, as the skilled person will recognize. For instance, the device may comprise any means necessary which are adapted to perform any of the embodiments described for the method aspect of the present invention.

According to preferred embodiments, all or part of the above is applied for the inspection of permanent magnets or magnet assemblies in industrial or academic applications, such as for sensor systems, switches and relays, electric motors, actuators, speakers, microphones, magnetic couplings, holding magnets, beam guiding systems, wigglers, undulators, permanent magnet bearings, measuring instruments, research equipment, new magnetic materials, non-destructive testing of magnetic materials such as steel.

Examples of industries where the present invention can be applied are: automotive, industrial, medical, consumer electronics, magnet production, research laboratories.

BRIEF DESCRIPTION OF THE DRAWINGS

The disclosure will be further elucidated by means of the following description and the appended figures.

FIGS. 1 to 8 illustrate embodiments of the present invention. FIGS. 3 to 8 illustrate examples of how additional distribution data for the component of the magnetic field vector can be generated, according to embodiments of the present invention.

DETAILED DESCRIPTION OF PREFERRED EMBODIMENTS

Figure 1:
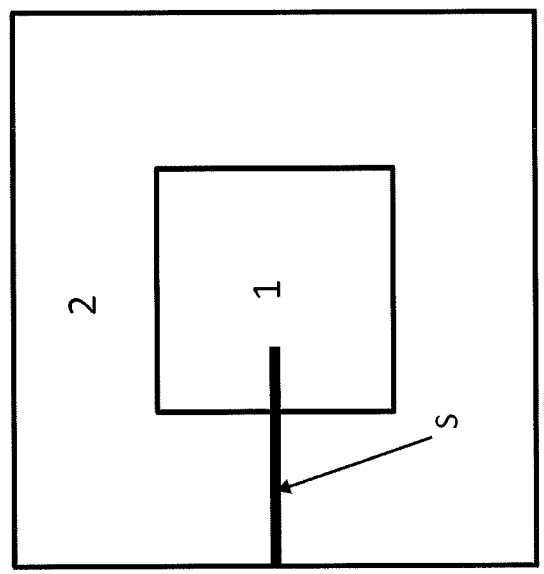

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

A method is described for determining values of a magnetic field component of a magnetic vector field, comprising:
  determining first distribution data comprising values of the magnetic field component, for a first predetermined area defined along a first predetermined surface;
  determining second distribution data comprising second values of the component of the magnetic field for a second predetermined area defined along a second predetermined surface, wherein the first and the second predetermined surfaces are parallel;
wherein determining second distribution data comprises manipulation of the distribution data based on making use of intrinsic physical properties of the magnetic field.

According to preferred embodiments of the present invention, determining second distribution data of the component comprises performing a Fourier transformation of the first distribution data resulting in Fourier transformed data, followed by performing data manipulation on the Fourier transformed data resulting in manipulated Fourier transformed data, followed by an inverse Fourier transformation of the manipulated Fourier transformed data.

Below, a derivation is presented demonstrating this aspect.

It is known to persons skilled in the art of physics that a magnetic vector field $\vec{B}=(B_x,B_y,B_z)$ can be expressed as $$\vec{B}=(B_x,B_y,B_z)=(\tfrac{\partial \Phi}{\partial x},\tfrac{\partial \Phi}{\partial y},\tfrac{\partial \Phi}{\partial z})=\nabla\Phi, \quad \text{Equation 1}$$

where $\Phi$ is the magnetic potential, and $\nabla$ is the "del" operator, also called "nabla" operator known to the skilled person.

One set of intrinsic physical properties of a harmonic potential field are the Green's Identities, which are known by persons skilled in the art of mathematics. Consider U to be a closed region in three-dimensional space, and $\partial U$ the boundary surface of this region. Consider $\Phi$ and $\Psi$ to be harmonic continuous functions with continuous partial derivatives of first and second orders in the region U. From Green's Second Identity it then follows that $$\frac{1}{4\pi}\oint_{\partial U}\left(\Phi\frac{\partial \Psi}{\partial n}-\Psi\frac{\partial \Phi}{\partial n}\right)dS=0, \quad \text{Equation 2}$$

where $$\frac{\partial \Phi}{\partial n}$$

is the directional derivative of $\Phi$ in the direction of the outward pointing normal $\vec{n}$ to the surface element dS.

If P is a point inside the closed region U, then it follows from Green's Third Identity that $$\Psi(P)=\frac{1}{4\pi}\oint_{\partial U}\left(\frac{1}{r}\frac{\partial \Phi}{\partial n}-\Phi\frac{\partial}{\partial n}\frac{1}{r}\right)dS, \quad \text{Equation 3}$$

where r is the distance between the surface portion dS and the point P.

It is known to persons skilled in the art of physics, that the magnetic potential $\Phi$ of Equation 1 is a harmonious function with continuous partial derivatives of first and second orders in a region U in three-dimensional space where no sources of magnetic field are present.

Consider a Cartesian coordinate system XYZ, in which one measures the magnetic field on a XY plane at a certain position $z_0$ along the Z axis. It is supposed that all sources of magnetic field are located at $z<z_0$, that means, below the measurement surface. Suppose that one wants to know the magnetic field at a point P with coordinates $(x,y,z_0+\Delta z)$, that means, at a distance $\Delta z$ above the measurement surface. One defines a region R in space enclosed by a disk with radius p lying in the measurement plane and a half sphere with the same centre and radius as the disk, extending from the disk circumference in the positive Z direction. It will be apparent to those skilled in the art that in this closed region Equation 3 is valid, whereby the function $\Phi$ is understood to be the magnetic potential. The integral in Equation 3 can thereby be expressed as the sum of a first integral over the disk lying in the XY plane, and a second integral over the hemisphere. Next it is considered that the value of $\rho$ evolves to infinity, in which case it is easily shown that the second integral, namely the one over the hemisphere, evolves to the value zero, and that the integration surface ∂U reduces to the complete XY plane (x',y',z₀). In the limit ρ→∞, Equation thus becomes:

$$\Phi(x, y, z_0 + \Delta z) = \frac{1}{4\pi}\int_{-\infty}^{+\infty}\int_{-\infty}^{+\infty}\left(\frac{1}{r}\frac{\partial\Phi(x', y', z_0)}{\partial z'} - \Phi(x', y', z_0)\frac{\partial}{\partial z'}\frac{1}{r}\right)dx'dy',$$

Equation 4 where $r=\sqrt{(x-x')^2+(y-y')^2+(z_0+\Delta z-z')^2}$, and where $\Delta z>0$.

Equation 4 contains a term with $$\frac{\partial \Psi(x', y', z_0)}{\partial z'},$$

which can be eliminated in the following way. By adding together Equation 2 and Equation 3, one obtains:

$$\Phi(P) = \frac{1}{4\pi}\oint_{\partial U}\left[\left(\Psi + \frac{1}{r}\right)\frac{\partial\Phi}{\partial n} - \Phi\frac{\partial}{\partial n}\left(\Psi + \frac{1}{r}\right)\right]dS.$$

Equation 5

One now defines the point P' as the mirror image of the point P with respect to the plane $z=z_0$, that means with P' having coordinates $(x,y,z_0-\Delta z)$, and one defines $\Psi=-1/\eta$, where $\eta=\sqrt{(x-x')^2+(y-y')^2+(z_0-\Delta z-z')^2}$. With this definition following conditions are satisfied: firstly, $$\Psi + \frac{1}{r} = 0$$

on the XY surface where $z=z_0$; secondly, $$\Psi + \frac{1}{r}$$

vanishes on the hemisphere in the limit ρ→∞; and thirdly, $\Psi$ is harmonic. In the limit ρ→∞ Equation 5 then becomes:

$$\Phi(x, y, z_0 + \Delta z) = -\frac{1}{4\pi}\int_{-\infty}^{+\infty}\int_{-\infty}^{+\infty}\Phi(x', y', z_0)\frac{\partial}{\partial z'}\left[\frac{1}{r}-\frac{1}{\eta}\right]dx'dy'.$$

Equation 6

When the derivative in this equation is calculated and z' is evolving to the XY plane, one obtains:

$$\Phi(x, y, z_0 + \Delta z) = -\frac{\Delta z}{2\pi}\int_{-\infty}^{+\infty}\int_{-\infty}^{+\infty}\frac{\Phi(x', y', z_0)}{[(x-x')^2 + (y-y')^2 + \Delta z^2]^{3/2}}dx'dy',$$

Equation 7 where $\Delta z>0$. Equation 7 can be used to calculate the potential $\Phi$ at a point $(x,y,z_0+\Delta z)$ based on measurements in a plane $(x',y',z_0)$.

In order to be useable in practice, Equation 7 can be considered in the Fourier domain. It is noted that Equation 7 has the form of a two-dimensional convolution:

$$\Phi(x,y,z_0+\Delta z)=\int_{-\infty}^{+\infty}\int_{-\infty}^{+\infty}\Phi(x',y',z_0)u(x-x',y-y',\Delta z)dx'dy',$$

Equation 8 where $$u(x, y, \Delta z) = \frac{\Delta z}{2\pi}\frac{1}{(x^2 + y^2 + \Delta z^2)^{3/2}}.$$

Equation 9

A convolution in the spatial domain corresponds to a multiplication in the Fourier domain. Therefore Equation 8 can be written as $$\hat{\Phi}(k_x,k_y,z+\Delta z)=\hat{\Phi}(k_x,k_y,z_0)\hat{u}(k_x,k_y,\Delta z),$$

Equation 10

Where $\hat{\Phi}(k_x,k_y,z+\Delta z)$ is the two-dimensional Fourier transform of the magnetic potential in the XY plane at $z=z_0+\Delta z$. The notation $\hat{F}$ denotes the Fourier transform of the function F.

Equation 9 can also be written as $$u(x, y, \Delta z) = -\frac{1}{2\pi}\frac{\partial}{\partial \Delta z}\frac{1}{r},$$

Equation 11 where $r=\sqrt{x^2+y^2+\Delta z^2}$. It can be shown that the Fourier transform of the function $1/r$ is given by:

$$\widehat{\tfrac{1}{r}} = 2\pi\frac{e^{-|k|\Delta z}}{|k|}, \quad |k| \neq 0.$$

Equation 12

The Fourier transform $\hat{u}(k_x,k_y,\Delta z)$ of the function $u(x,y,\Delta z)$ is then calculated as follows:

$$\begin{aligned}\hat{u}(k_x, k_y, \Delta z) &= -\frac{1}{2\pi}\frac{\partial}{\partial \Delta z}\widehat{\tfrac{1}{r}}\\ &= -\frac{\partial}{\partial \Delta z}\frac{e^{-|k|\Delta z}}{|k|}\\ &= e^{-|k|\Delta z}, \Delta z > 0,\end{aligned}$$

Equation 13 where $|k| = \sqrt{k_x^2 + k_y^2}$.

Equation 10 was derived for the magnetic potential $\Phi$. It is now shown that it is also valid for each magnetic field component $B_x$, $B_y$ and $B_z$ separately. From Equation 1, Equation 10 and Equation 13 it follows that $$\begin{aligned}\vec{B}_{x,y}(k_x, k_y, z_0 + \Delta z) &= -\left(\frac{\overline{\partial}}{\partial x, y}\hat{\Phi}\right)(k_x, k_y, z_0 + \Delta z)\\ &= -ik_{x,y}\hat{\Phi}(k_x, k_y, z_0 + \Delta z)\\ &= -ik_{x,y}\hat{\Phi}(k_x, k_y, z_0)\hat{u}(k_x, k_y, \Delta z)\\ &= -\widehat{(\tfrac{\partial}{\partial x,y}\Phi)}(k_x, k_y, z_0)\hat{u}(k_x, k_y, \Delta z)\\ &= \vec{B}_{x,y}(k_x, k_y, z_0)\hat{u}(k_x, k_y, \Delta z)\\ &= \vec{B}_{x,y}(k_x, k_y, z_0)e^{-|k|\Delta z}\end{aligned}$$

Equation 14 and

-continued $$\vec{B_z}(k_x, k_y, z_0 + \Delta z) = -\frac{\partial \Phi}{\partial z}(k_x, k_y, z_0 + \Delta z) \quad \text{Equation 1}$$
$$= -|k|\hat{\Phi}(k_x, k_y, z_0 + \Delta z)$$
$$= -|k|\hat{\Phi}(k_x, k_y, z_0)\hat{u}(k_x, k_y, \Delta z)$$
$$= -\frac{\partial \Phi}{\partial z}(k_x, k_y, z_0)\hat{u}(k_x, k_y, \Delta z)$$
$$= \vec{B_z}(k_x, k_y, z_0)\hat{u}(k_x, k_y, \Delta z)$$
$$= \vec{B_z}(k_x, k_y, z_0)e^{-|k|\Delta z}$$

In Equation 14 and Equation 15 the following properties were used, which are known to persons skilled in the art:

$$\frac{d^n\Phi}{dx^n} = (ik_x)^n\hat{\Phi} \quad \text{Equation 16}$$
$$\frac{d^n\Phi}{dy^n} = (ik_y)^n\hat{\Phi}$$
$$\frac{d^n\Phi}{dz^n} = |k|^n\hat{\Phi}$$

Equation 14 and Equation 15 show that the result of Equation 10 can be applied to each component of the vector field derived from Φ, as summarized here:

$$\widetilde{B_{x,y,z}}(k_x, k_y, z_0 + \Delta z) = \widetilde{B_{x,y,z}}(k_x, k_y, z_0)e^{-|k|\Delta z}. \quad \text{Equation 17}$$

It follows from Equation 17 that the magnetic field in the XY plane at $z=z_0+\Delta z$ can be obtained from the magnetic potential in the XY plane at $z=z_0$ by first performing a Fourier transform, then multiplying by $e^{-|k|\Delta z}$, and then performing an inverse Fourier transform.

Although in the derivation of Equation 17 it is assumed that $\Delta z > 0$, which means that the field is calculated at distances farther away from the magnetic field source, it can also be applied with $\Delta z < 0$, that means, to calculate the magnetic field at distances closer to the magnetic field source. A condition is that the position where the field is calculated is still in a region free from magnetic field sources. In practice this means that it is possible to measure the magnetic field at a certain distance from a magnet, and that the field can be calculated at positions closer to the magnet, even up to the magnet surface. Since existing magnetic field sensors and magnetic field camera devices often have a minimum measurement distance from the magnet, it is an advantage of the present invention to be able to calculate the field at closer distances to the magnet.

Although Equation 17 was derived for the case of a Cartesian coordinate system, the same principle can be applied in other coordinate systems, such as the cylindrical coordinate system. First, one considers the case in which any component of the magnetic field is recorded on a flat disk or ring surface in a cylindrical coordinate system (R, θ, Z). Since the predetermined area is in a flat surface, it can be projected onto a plane in the Cartesian coordinate system. Thereby it is noted that the data grid in the cylindrical coordinate system may not transform to a regular grid in the Cartesian coordinate system. However, the transformed grid can be made regular again by interpolation methods which are well known to persons skilled in the art. To the obtained data, Equation 17 can be applied, in order to obtain the magnetic field at another distance in the Z-direction. The coordinates of the obtained data are then transformed back to the cylindrical coordinate system. Thereby, according to preferred embodiments, another interpolation step is performed in order to obtain the data values at the original grid points in the cylindrical coordinate system.

In order to obtain suitable boundary conditions on the outer periphery of the transformed disk surface in Cartesian coordinates, it is preferred to apply extrapolation methods according to methods described in the present disclosure.

The person skilled in the art will recognize that the above method equally applies to a ring surface, where only the area between an inner radius and an outer radius is considered. Thereby, the inner disk surface, on which no data points are present, may be extrapolated according to methods described in the present invention.

The principle of Equation 17 can be used also for data on a curved cylinder surface, in order to calculate the magnetic fields at radial distances different from this surface. This is already apparent from Equation 3, which says that the magnetic field in a closed region can be deduced from the field on the boundary of that region. For the case where the predetermined area is a curved cylinder surface with radius $R_0$, consider the region bound by two cylinders, one with radius $R_0$ and one with radius $R_1$ with $R_0 < R_1$, and both extending from $-z_0$ to $+z_0$ in the Z-direction. In analogy to the given derivation for the Cartesian coordinate system, it is apparent that the integrand of Equation vanishes on the outer cylinder and on the planar ring surfaces in the limit where $R_1, z_0 \to \infty$, which means that the field at any point in the region $R > R_0$ can be derived from the field at $R_0$ using an expression similar to Equation 17, expressed in cylindrical coordinates.

Furthermore, it will be apparent to those skilled in the art that this method is equally applicable to determine the field at a radius $R < R_0$, assuming that no magnetic field sources are present in the region between R and $R_0$.

When the distribution of the measured magnetic field component on the boundaries of the predetermined area is not approaching zero, because for example the magnetic object is larger than the measurement area of the magnetic field camera, it can be needed to extend the predetermined measurement area in order to make sure that the measured distribution is sufficiently approaching zero at its boundaries, so that the methods of the present invention can be applied. For such case, it may be needed to measure a larger area by stepping the measurement area in the first and/or second directions, and at each new location measure the distribution in a new predetermined area which is adjacent to the previous predetermined area, after which all determined distributions are 'stitched' together as to result in one large predetermined area, on the borders of which the magnetic field has sufficiently evolved towards zero as to apply the extrapolation methods described in the present disclosure, with the aim of determining second distribution data comprising second values of the component of the magnetic field for a second predetermined area defined along a second predetermined surface, wherein the first and the second predetermined surfaces are parallel. Methods and devices for accomplishing this are for example described in European patent application EP12188521.4 filed on 15 Oct. 2012 by the applicant of the present application, which are hereby incorporated by reference. Such a device can be described as a device for determining a magnetic field distribution of a magnet along a main surface of the magnet, the device comprising:

a. an arrangement of at least two independent magnetic field camera modules being arranged in a fixed relative position with respect to each other, each magnetic field camera module being adapted for measuring a magnetic field distribution to which it is exposed by means of a respective detection surface;

b. a means for providing a predetermined relative movement between the main surface and the arrangement to thereby scan the magnetic field distribution of the magnet along the main surface.

The associated method is a method for determining a magnetic field distribution of a magnet along a main surface of the magnet, the device comprising:

providing the magnet;

providing an arrangement of at least two independent magnetic field camera modules being arranged in a fixed relative position with respect to each other, each magnetic field camera module being adapted for measuring a magnetic field distribution to which it is exposed by means of a respective detection surface;

providing a predetermined relative movement between the main surface and the arrangement to thereby scan the magnetic field distribution of the magnet along the main surface.

In order to determine the second distribution data comprising second values of the magnetic field component for this stitched distribution, the methods described in the present invention can be applied to the resulting (stitched) predetermined area.

Another method however is to apply the so-called 'overlap-add' and 'overlap-save' methods, which are known to persons skilled in the art of signal processing, whereby the Fourier transform, data manipulation based on intrinsic physical properties of a magnetic vector field, and inverse transform are performed on sub areas of the respective predetermined areas or combination of predetermined area and extension area.

The overlap-add and overlap-save methods can also be applied in the other cases described in the present disclosure in the following way. Instead of first determining the additional distribution data in the extended area, and after that applying data manipulation based on intrinsic physical properties of a magnetic vector field (for instance comprising applying a Fourier transform, manipulating the Fourier transformed data, and performing an inverse Fourier Transform) in order to obtain the second distribution data of the component, the Fourier Transform, data manipulations, and Inverse Fourier Transform are applied separately to the predetermined area and to (sub-regions of) the extended area in a block-wise fashion. Thereby each of the blocks can be zero padded to a certain extent in order to create overlap regions between the back-transformed blocks. The resulting back-transformed blocks are then combined in the final larger matrix, whereby the overlap regions are added together. Additionally, the predetermined area can itself also be treated block-wise, for example in the case of a large magnet where the predetermined area is relatively large and is measured in a block-wise way. This method corresponds to the overlap-add method. A person skilled in the art will readily recognize the analogous possibility of applying the overlap-save method to the same data.

Alternatively, the predetermined and extended areas can be treated block-wise or section-wise, where the manipulations are performed on each block/section separately, and the results of them added together or saved according to overlap-add and overlap-save methods, respectively.

As a further improvement on the previous method, the overlap-add and overlap-save methods can also be used on an infinite extension area, where the extrapolation is expressed as an analytical function which the Fourier transform and other operations can be analytically determined on the interval stretching from infinity to the border of the predetermined area.

Distribution data of the component of the magnetic vector field in the extension area can be determined in many ways, some of which are explained below.

FIGS. 3 to 8 illustrate examples of how additional distribution data for the component of the magnetic vector field can be generated, according to embodiments of the present disclosure. The depicted patterns illustrate the evolution of the values of the component, the z-component of the magnetic field, along to a cross-section S as depicted in FIG. 1. The cross-section can comprise an outer portion of the predetermined area only, but can extend up until the centre of the predetermined area.

Figure 3:
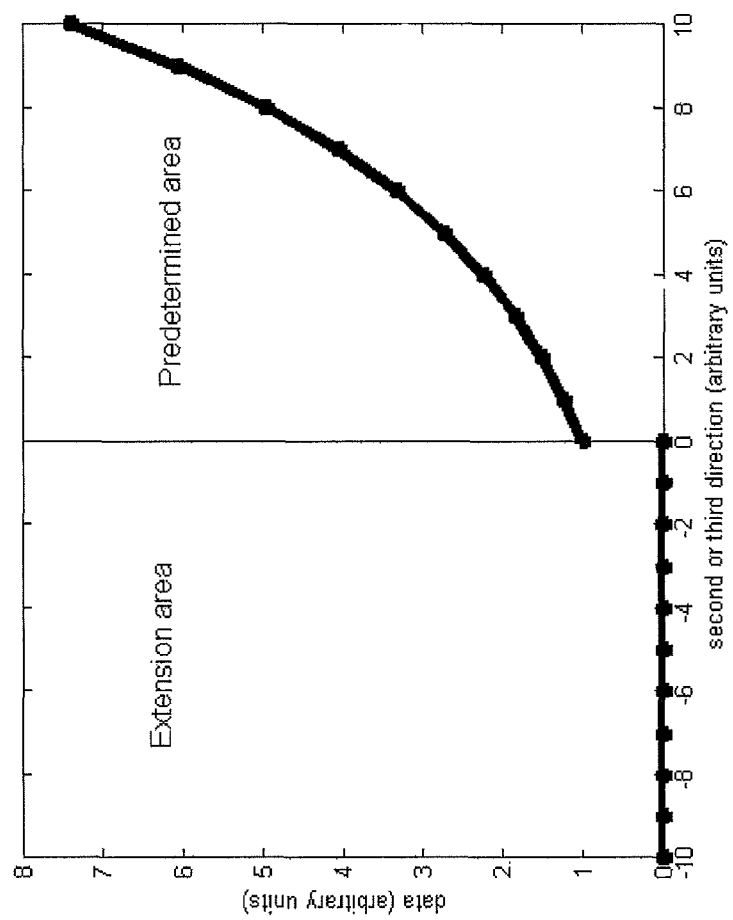

According to a first embodiment, illustrated in FIG. 3, the component of the magnetic field vector is set to value zero (0) in the complete extension area. When the measured values of the component of the magnetic vector field on the outer boundary of the predetermined area differ from zero, the method may though introduce a discontinuity in the values on the outer boundary of the predetermined area, which may still introduce errors in a subsequent calculation of the second distribution data of the component of the magnetic field vector.

Figure 8:
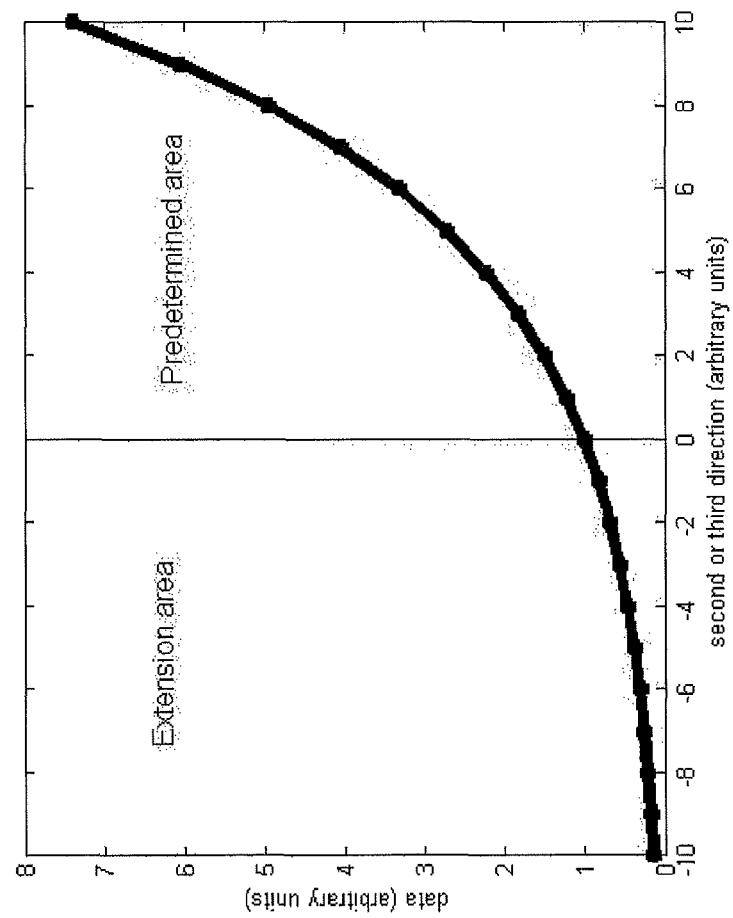

According to an alternative embodiment, illustrated in FIG. 8, of the present disclosure, the additional distribution data comprising the component of the magnetic field vector is simulated or modeled for the predetermined area and the simulation results or model are/is extrapolated into the extension area.

Figure 2:
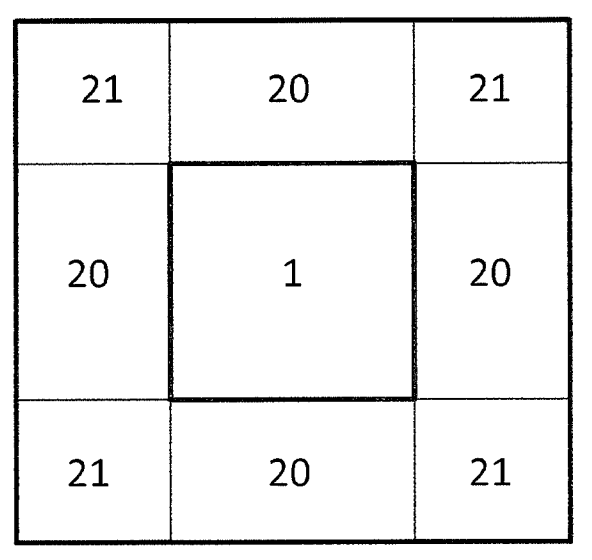

According to preferred embodiments, illustrated in FIG. 2, the magnetic field component at locations lying in the extension area may be set to the same value as the nearest point in the predetermined area. For a rectangular predetermined area, this would mean that the boundary values of the predetermined area and thus measured area are set as a fixed, constant, value throughout the extension area along a direction which is orthogonal on the outer boundary of the predetermined area (portions 20). In the corner areas which are then remaining (21), the value of the corresponding corner of the predetermined area is set as a constant value. Subsequently, a window function is applied on the predetermined area and the extension area, which has a value "1" in the predetermined or measured area and which evolves continuously to a (near to) zero value on the outer boundary of the predetermined area. For instance, the window function can be a Tukey-window (illustrated in FIG. 5) or a Planck-Taper window. Alternatively a so-called "bump-function" or a "test-function" can be used, which have the property that they evolve from a value 1 to a value zero within a limited area, whereby they can be infinitely differentiated, and whereby they thus do not introduce discontinuities in the function or any of its first or higher order derivatives, which makes them suitable for being used as a window function in this context.

Figure 4:
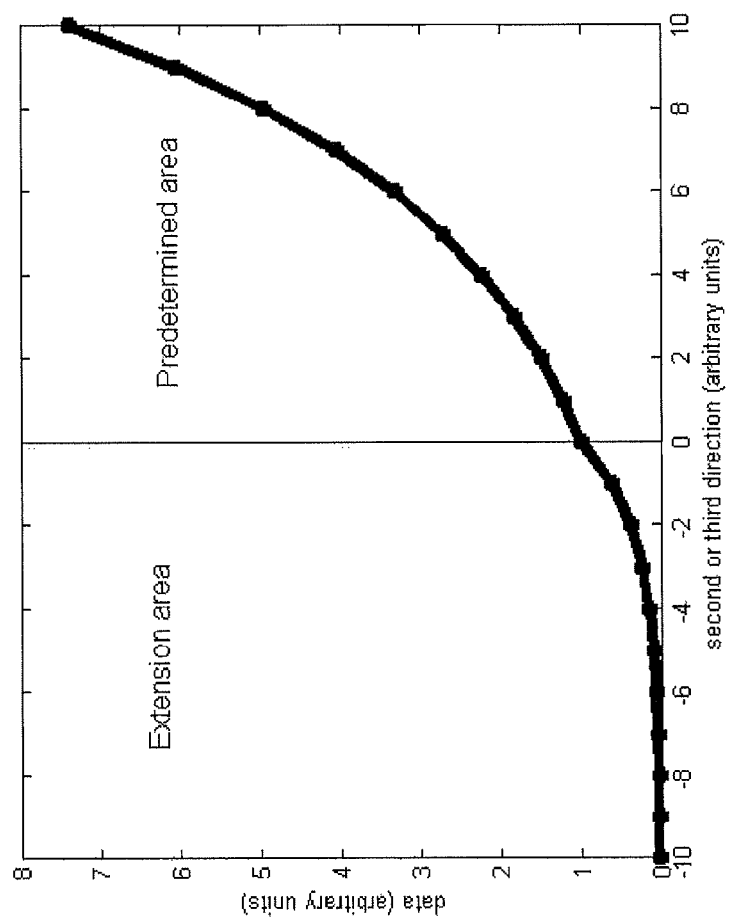
Figure 5:
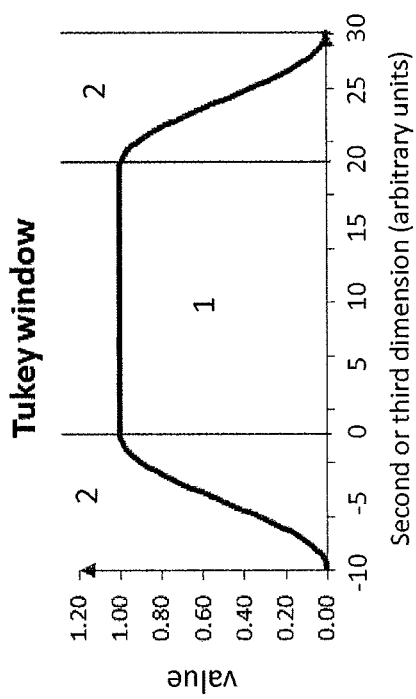

According to a further embodiment, illustrated in FIG. 4, the values of the component of the magnetic vector field at the outer boundary of the predetermined area are set to be evolving exponentially towards a zero value within the extension area. Preferably the exponential factor is predetermined such that its sufficiently small value or zero value is achieved on the outer boundary of the extension area. In practice, it is enough that the magnetic field distribution on the outer boundary of the extension area has a value which is below the measurement noise. This method guarantees the continuity of the values on the outer border of the predetermined area, but does not guarantee the continuity of the first derivative thereof.

In a further preferred embodiment, the component of the magnetic vector field in the (boundary area of the) predetermined area is represented by a polynomial representation. The order of the extrapolated polynomial function can be reduced, for instance to order two ("quadratic polynomial"), or to order one ("linear polynomial"), in order not to obtain instable extrapolation values. This method guarantees that the continuity of the measurement values and of the derivatives is ascertained to the same extent as the order of the used polynomial function. In practice, it is further preferred to further apply a window-function on these extrapolated values, such that it can be guaranteed that the distribution of the component of the magnetic field vector reaches a value which is small enough or zero at the outer boundary of the extension area.

In a further preferred embodiment, the component of the magnetic vector field in the (boundary area of the) predetermined area is represented by a rational function representation. The order of the extrapolated rational function can be chosen, for instance to order −1 ("1/x"), order −2 ("$1/x^2$") or order −3 ("$1/x^3$"). The latter case is particularly useful since it corresponds to the decline rate of the magnetic field of a magnetic dipole, which is an approximation of a magnet at large distances from the magnet field source, e.g. magnet. This method guarantees that the magnetic field approaches zero when moving further into the extension area. In practice, it can further be preferred to apply a window-function on these extrapolated values, such that it can be guaranteed that the distribution of the component of the magnetic field vector reaches a value which is small enough or zero at the outer boundary of the extension area.

Figure 6:
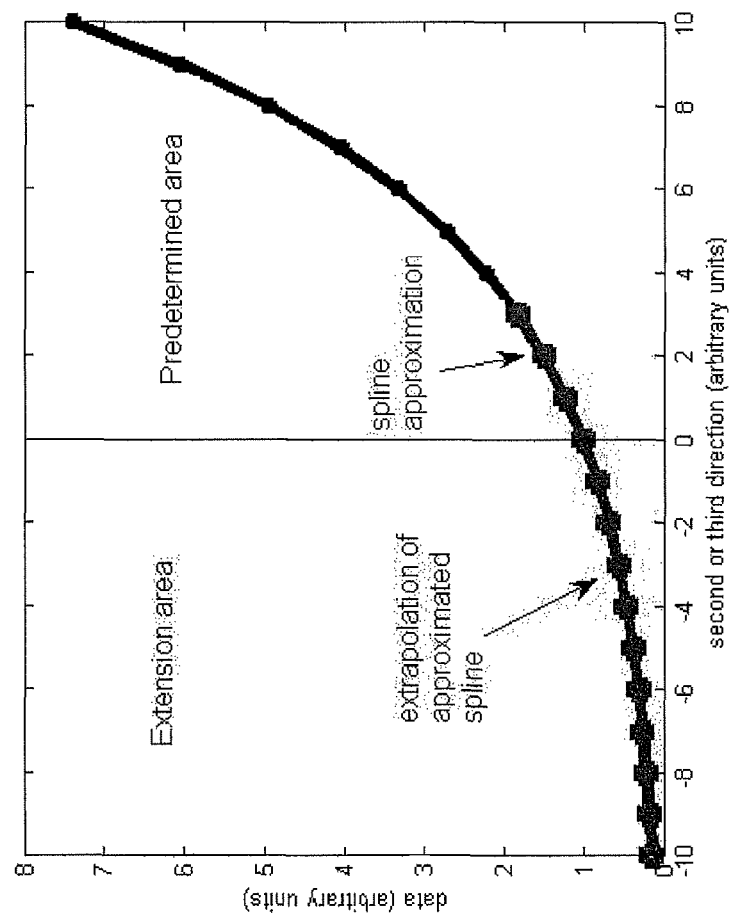
Figure 7:
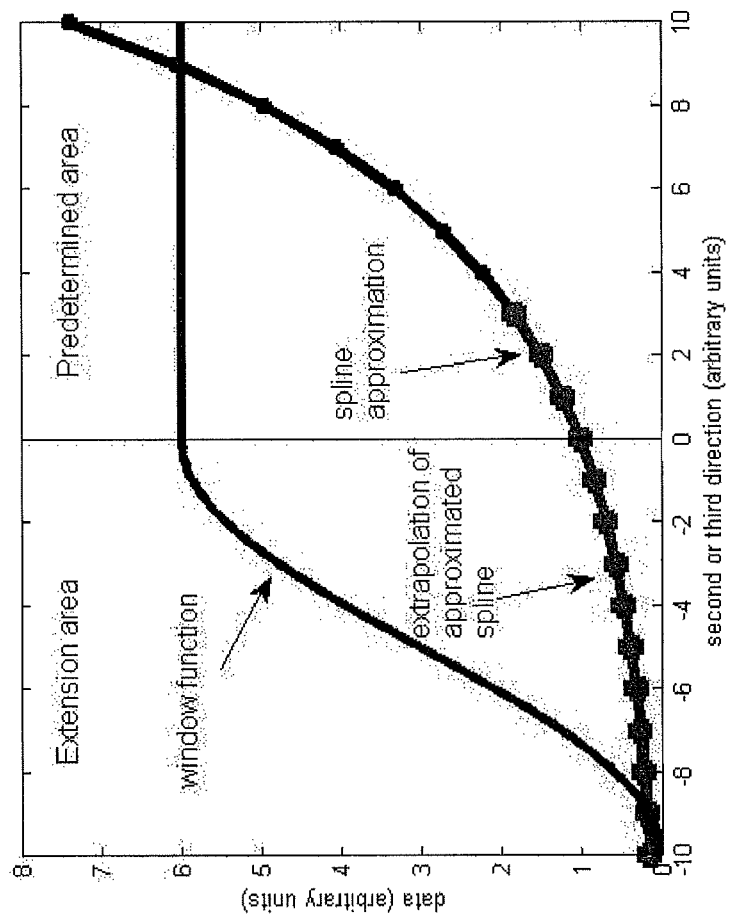

In a further preferred embodiment, the component of the magnetic vector field in the (boundary area of the) predetermined area is represented by a "spline"-representation, illustrated in FIG. 6. The order of the extrapolated spline-function can be reduced, for instance to order two ("quadratic spline"), or to order one ("linear spline"), in order not to obtain instable extrapolation values. This method guarantees that the continuity of the measurement values and of the derivatives is ascertained to the same extent as the order of the used spline-function. In practice, it is further preferred to further apply a window-function on these extrapolated values, such that it can be guaranteed that the distribution of the component of the magnetic field vector reaches a value which is small enough or zero at the outer boundary of the extension area. This is illustrated in FIG. 7.

According to a still further embodiment of the present disclosure, the values of the component of the magnetic field at the boundary of the predetermined area can be extrapolated on the basis of a simulated magnetic field distribution for the magnetic object of which the magnetic field distribution was measured. Simulation algorithms can be used to calculate the magnetic field distribution based for instance on one or more properties of the magnetic object such as for instance shape, material, magnetization vector, position and so forth. Also here, use can be made of any of the methods disclosed for instance in EP2508906.

According to another embodiment of the present disclosure, the determination of the second distribution data of the component of the magnetic field distribution of a 'stitched' predetermined area is performed in the following way, by using the 'overlap-add' or 'overlap-save' method. Thereby the Fourier transform, manipulation operations and inverse Fourier transform are performed on each individual predetermined area, which may or may not be zero padded, without applying the extrapolation methods described in the current disclosure. When combining the determined second data distributions of the component into the larger distribution, the overlap-save or overlap-add method can be applied.

According to another embodiment of the present disclosure, the overlap-add or overlap-save method is used on a finite or an infinite extension area.

The invention claimed is:

1. A method of inspecting the magnetic properties of a magnetic object to determine its quality, comprising:
    placing a first predetermined surface of the magnetic object in a sensing area of a magnetic camera device comprising a plurality of magnetic field sensors, arranged as a two-dimensional (2D) grid on an xy plane at a position $Z_0$ along a z-axis perpendicular to the xy plane, and adapted to receive a magnetic field component from the magnetic object, wherein the magnetic object is placed in the sensing area at a position $z_1 \neq Z_0$;
    measuring the magnetic object using the magnetic camera device, to obtain a 2D distribution of a magnetic field on the 2D grid, the magnetic object under inspection acting as a source of the magnetic field;
    obtaining a first magnetic field component from the magnetic object at $Z_0$ by determining a first distribution data comprising values of said first magnetic field component, for the sensing area, wherein determining first distribution data comprises measuring values of said component on the 2D grid by means of the magnetic camera device to obtain the 2D distribution of the magnetic field;
    obtaining a second magnetic field component from the magnetic object by determining second distribution data comprising values of said second magnetic field component, for a second area of a second plane parallel to the sensing area and at a position $z_2$ defined as a distance $\Delta z$ from the sensing area, said determining second distribution data comprising manipulation of said first distribution data based on intrinsic physical properties of at least one of: the magnetic field vector, and said magnetic field component, from the magnetic object under inspection; said determining second distribution data further comprising computer-implemented steps of:
        performing a Fourier transformation of said first distribution data resulting in Fourier transformed data;
        followed by performing data manipulation comprising multiplying said Fourier transformed data obtained at $z_0$ by $e^{-|k|\Delta z}$, resulting in manipulated Fourier transformed data;
        followed by performing an inverse Fourier transformation of said manipulated Fourier transformed data; and
        determining a magnetic field distribution in a three-dimensional (3D) volume, wherein:
    $|k|$ in said $e^{-|k|\Delta z}$ is a magnitude of a spatial frequency vector determined by first and second directions defining the second plane of the sensing area in a Fourier domain; and
    determining the magnetic quality of the magnetic object under inspection based on the determined second distribution data.

2. The method according to claim 1, wherein said first magnetic field component comprises a magnitude of projection of a magnetic field vector on an axis or on a surface, or a magnitude of the magnetic field vector.

3. The method according to claim 1, wherein determining first distribution data further comprises modeling said first magnetic field component based on a predetermined model and/or predetermined input parameters.

4. The method according to claim 1, wherein said first distribution data of said first magnetic field component comprises non-zero values corresponding to a location at an outer border of said first predetermined surface.

5. The method according to claim 1, further comprising:
generating additional distribution data of said magnetic field component, said additional distribution data comprising expected values for said magnetic field component in an extension area, said extension area adjacent to said sensing area and along said first predetermined surface; and
determining second distribution data for an extended set of distribution data, said extended set of distribution data comprising said first distribution data and said additional distribution data.

6. The method according to claim 5, wherein said expected values of said magnetic field component for the additional distribution data are set to be monotonously decreasing to zero in said extension area when moving from an outer boundary of said first predetermined surface, away from said first predetermined area, towards an outer border of said extension area.

7. A device for inspecting a magnetic object, comprising:
a magnetic camera device comprising a plurality of magnetic field sensors arranged as a two-dimensional (2D) grid on an xy plane at a position $Z_0$ along a z-axis perpendicular to the xy plane, and adapted to measure a first distribution data comprising values of a magnetic field component of the magnetic object, placed in a sensing area of the magnetic camera device at a position $z_1 \neq Z_0$, wherein said magnetic camera device is configured to measure the magnetic object to obtain a 2D distribution of a magnetic field on the 2D grid, the magnetic object under inspection acting as a source of the magnetic field;
means for obtaining a second magnetic field component from the magnetic object by determining a second distribution data comprising values of said second magnetic field component, for a second area of a second plane parallel to the sensing area and at a position $z_2$ defined as a distance $\Delta z$ from the sensing area, wherein determining second distribution data comprises manipulation of said first distribution data based on intrinsic physical properties of at least one of: the magnetic vector field, and said magnetic field component, from the magnetic object under inspection, and wherein, for determining the second distribution data, said means for obtaining the second magnetic field component is configured to:
perform a Fourier transformation of said first distribution data resulting in Fourier transformed data;
followed by performing data manipulation comprising multiplying said Fourier transformed data obtained at $z_0$ by $e^{-|k|\Delta z}$, resulting in manipulated Fourier transformed data;
followed by performing an inverse Fourier transformation of said manipulated Fourier transformed data; and
determining a magnetic field distribution in a three-dimensional (3D) volume, wherein:
|k| in said $e^{-|k|\Delta z}$ is a magnitude of a spatial frequency vector determined by first and second directions defining the second plane of the sensing area in a Fourier domain; and
the determined second distribution data is applied to a determination of the magnetic quality of the magnetic object under inspection.

8. The method of claim 1, wherein the method is a method of inspecting a permanent magnet or magnet assembly, and the method further comprises outputting a result of the permanent magnet or magnet assembly inspection.

9. The method of claim 8, wherein the outputting step relies on the first and second distribution data.

10. The method of claim 1, wherein the spacing of the 2D grid is less than 1 mm in orthogonal directions parallel the xy plane.

11. The method of claim 1, wherein the spacing of the 2D grid is less than 0.2 mm in orthogonal directions parallel the xy plane.

12. The method of claim 1, wherein $\Delta z$ is greater than zero.

13. The method of claim 1, wherein $\Delta z$ is less than zero.

14. The method of claim 1, wherein the computer-implemented step of determining second distribution data further comprise defining the second area of the second plane.

15. The method of claim 14, wherein the computer-implemented step of determining second distribution data further comprise defining the second area of the second plane at a location free from magnetic field sources.

16. The method of claim 1, wherein the computer-implemented step of determining second distribution data further comprise defining a magnitude of the distance $\Delta z$.

17. The method of claim 1, wherein said measuring the magnetic object comprises scanning the magnetic object in one direction using the magnetic camera device to obtain the 2D distribution of the magnetic field on the 2D grid.

18. The method of claim 17, wherein the one direction for said scanning is one of: in a Cartesian direction, in an axis in a cylindrical coordinate system, and in a spherical coordinate system.

19. The method of claim 17, wherein the magnetic object includes a magnet, and wherein said scanning the magnetic object comprises scanning the magnetic object including the magnet in the one direction using the magnetic camera device.

20. The method of claim 19, wherein said determining the magnetic quality of the magnetic object comprises determining the magnetic quality of the magnetic object including the magnet.

21. The method of claim 17, wherein the magnetic object is a magnet, and wherein said scanning the magnetic object comprises scanning the magnet in the one direction using the magnetic camera device.

22. The method of claim 21, wherein said determining the magnetic quality of the magnetic object comprises determining the magnetic quality of the magnet.

23. The method of claim 1, wherein $z_1$ is less than $Z_0$.

24. The method of claim 1, wherein the magnetic field distribution includes a z-component, the z-component being out of plane with respect to a plane defined by an x-axis and a y-axis in the 3D volume.

* * * * *